(12) United States Patent
Iizuka

(10) Patent No.: US 11,521,877 B2
(45) Date of Patent: Dec. 6, 2022

(54) CARRIER TRAY

(71) Applicant: DISCO CORPORATION, Tokyo (JP)

(72) Inventor: Kentaro Iizuka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 204 days.

(21) Appl. No.: 17/168,349

(22) Filed: Feb. 5, 2021

(65) Prior Publication Data

US 2021/0265186 A1 Aug. 26, 2021

(30) Foreign Application Priority Data

Feb. 20, 2020 (JP) .............................. JP2020-026979

(51) Int. Cl.
*H01L 21/673* (2006.01)

(52) U.S. Cl.
CPC ................. *H01L 21/67333* (2013.01); *H01L 2221/68313* (2013.01)

(58) Field of Classification Search
CPC ............. H01L 21/67333; H01L 21/673; H01L 2221/68313; H01L 21/6734; B65D 73/02
USPC ....... 206/701, 710, 712, 703, 706, 724, 722, 206/557, 560, 564, 565; 211/41.18
See application file for complete search history.

(56) References Cited

U.S. PATENT DOCUMENTS

| | | | | | |
|---|---|---|---|---|---|
| 5,026,303 | A * | 6/1991 | Matsuoka | ............ | H05K 7/1023 439/526 |
| 5,971,156 | A * | 10/1999 | Slocum | ............ | H01L 21/67333 206/724 |
| 6,889,841 | B2 * | 5/2005 | Maccoux | ........... | H05K 13/0084 324/750.25 |
| 7,395,933 | B2 * | 7/2008 | Ruth | ................. | G01R 31/2893 206/724 |
| 10,840,116 | B2 * | 11/2020 | Iizuka | ................ | B24B 27/0069 |
| 2002/0070144 | A1 * | 6/2002 | Shim | .................. | G01R 31/2893 206/706 |

FOREIGN PATENT DOCUMENTS

| | | | | |
|---|---|---|---|---|
| JP | 2000094221 A | | 4/2000 | |
| JP | 2019106458 A | | 6/2019 | |
| KR | 100792487 B1 | * | 1/2008 | |
| KR | 20080037251 A | * | 4/2008 | |
| KR | 20100030118 A | * | 3/2010 | |
| WO | WO-0207962 A1 | * | 1/2002 | ............... B32B 7/12 |

* cited by examiner

*Primary Examiner* — Rafael A Ortiz
(74) *Attorney, Agent, or Firm* — Greer Burns & Crain Ltd.

(57) ABSTRACT

A carrier tray includes a housing, an ingot accommodating recess that accommodates a semiconductor ingot, and a wafer accommodating recess that accommodates a wafer. The housing has an upper wall, a lower wall, a pair of side walls connecting the upper wall and the lower wall to each other, and a tunnel defined by the upper wall, the lower wall, and the pair of side walls. A plurality of levers each of which has a point of application projecting from a bottom surface of the ingot accommodating recess, a point of action projecting from a side surface of the ingot accommodating recess, and a fulcrum formed between the point of application and the point of action are each attached to the housing so as to be rotatable around the fulcrum.

2 Claims, 6 Drawing Sheets

CARRIER TRAY

BACKGROUND OF THE INVENTION

Field of the Invention

The present invention relates to a carrier tray to be used in a wafer forming apparatus for forming a wafer from a semiconductor ingot.

Description of the Related Art

Devices such as integrated circuits (ICs), large scale integration (LSI) circuits, and light emitting diodes (LEDs) are formed on a functional layer stacked on a front surface of a wafer including a material of silicon (Si), sapphire ($Al_2O_3$), or the like, in respective regions partitioned by a plurality of intersecting streets. In addition, power devices, LEDs, and the like are formed on a functional layer stacked on a front surface of a wafer including a material of single crystal silicon carbide (SiC), in respective regions partitioned by a plurality of intersecting streets. The wafer formed with the devices is subjected to processing along the streets by a cutting apparatus and a laser processing apparatus and divided into individual device chips, and the device chips are utilized for electric equipment such as mobile phones and personal computers.

The wafer to be formed with devices is in general formed by cutting a cylindrical ingot into a thin form by a wire saw. A front surface and a back surface of the thus cut wafer are polished and finished as a mirror surface (see, for example, Japanese Patent Laid-open No. 2000-94221). However, when the ingot is cut by a wire saw and the front surface and the back surface of the wafer thus cut are polished, most (70% to 80%) of the ingot is thrown away, which is uneconomical. Particularly, a single crystal SiC ingot is so hard that it is difficult to cut the ingot by a wire saw and it takes considerable time, so that productivity is low, and the ingot is high in unit cost. Accordingly, there is a problem as to forming wafers efficiently.

In view of the foregoing, a technology has been proposed in which a laser beam of such a wavelength as to be transmitted through single crystal SiC is applied to a single crystal SiC ingot with a focal point of the laser beam positioned inside the single crystal SiC ingot to form a peeling layer at a scheduled cutting plane, and a wafer is peeled off from the single crystal SiC ingot along the scheduled cutting plane where the peeling layer has been formed (see, for example, Japanese Patent Laid-open No. 2019-106458).

SUMMARY OF THE INVENTION

In the wafer forming apparatus disclosed in Japanese Patent Laid-open No. 2019-106458, the ingot and the wafer peeled off therefrom are carried in the state of being put on a carrier tray, between units such as an ingot grinding unit and a laser applying unit. However, the carrier tray has a problem in that the ingot is instable relative to the carrier tray when the ingot is carried while being supported by an ingot support section, and the ingot may fall off from the carrier tray.

Accordingly, it is an object of the present invention to provide a carrier tray which can stably hold an ingot and prevent the ingot from falling off during carrying of the ingot.

In accordance with an aspect of the present invention, there is provided a carrier tray to be used in a wafer forming apparatus for forming a wafer from a semiconductor ingot. The carrier tray includes: a housing that includes an upper wall, a lower wall, a pair of side walls connecting the upper wall and the lower wall to each other, and a tunnel defined by the upper wall, the lower wall, and the pair of side walls; an ingot accommodating recess that is formed in the upper wall of the housing and accommodates the semiconductor ingot; a wafer accommodating recess that is formed in the lower wall of the housing and accommodates a wafer; and a plurality of levers each of which has a point of application projecting from a bottom surface of the ingot accommodating recess, a point of action projecting from a side surface of the ingot accommodating recess, and a fulcrum formed between the point of application and the point of action, each of the levers being attached to the housing so as to be rotatable around the fulcrum. When the semiconductor ingot is accommodated in the ingot accommodating recess, the points of application of the levers are operated by a weight of the semiconductor ingot itself, and a side surface of the semiconductor ingot is supported by the points of action of the levers.

Preferably, the ingot accommodating recess includes a plurality of accommodating recesses which are concentric and correspond to a plurality of sizes of semiconductor ingots.

According to the present invention, since the points of application are operated by the weight of the ingot itself and the side surface of the ingot is supported by the points of action, the ingot can be held stably and prevented from falling off during carrying of the ingot.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
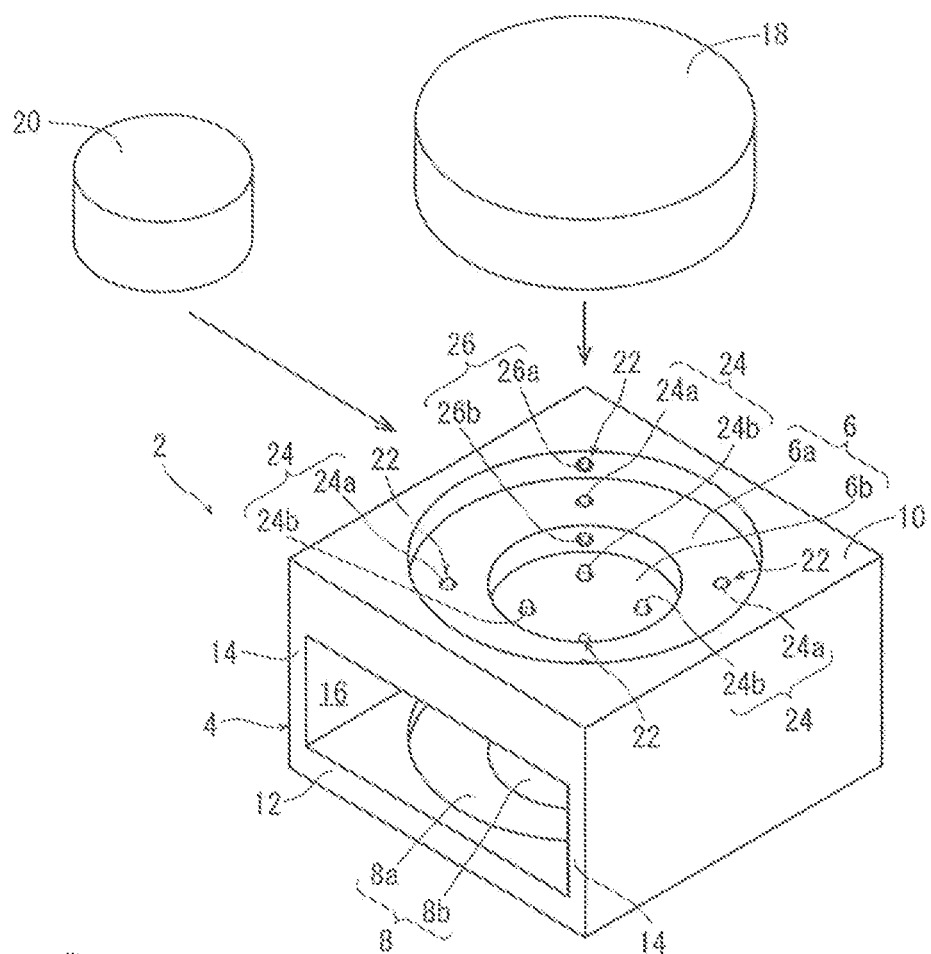
FIG. 1 is a perspective view of a carrier tray according to an embodiment of the present invention.

A carrier tray according to a preferred embodiment of the present invention will be described below referring to the drawings. A carrier tray denoted as a whole by a reference symbol 2 in FIG. 1 includes a housing 4, an ingot accommodating recess 6 that accommodates a semiconductor ingot (hereinafter referred to simply as an ingot), and a wafer accommodating section 8 that accommodates a wafer.

The housing 4 includes a rectangular upper wall 10, a rectangular lower wall 12 disposed on a lower side of the upper wall 10, a pair of rectangular side walls 14 connecting the upper wall 10 and the lower wall 12 to each other, and a tunnel 16 defined by the upper wall 10, the lower wall 12, and the pair of side walls 14.

As illustrated in FIG. 1, the ingot accommodating recess 6 is formed in an upper surface of the upper wall 10 of the housing 4. The ingot accommodating recess 6 in the present embodiment has an annular first ingot accommodating recess 6a recessed downward from the upper surface of the upper wall 10, and a circular second ingot accommodating recess 6b smaller in diameter than the first ingot accommodating recess 6a and recessed further downward as compared to the first ingot accommodating recess 6a. The first ingot accommodating recess 6a and the second ingot accommodating recess 6b are formed concentrically.

The diameter of the first ingot accommodating recess 6a is slightly (on the order of several millimeters) larger than that of a cylindrical ingot 18 having a comparatively large diameter (for example, a diameter of six inches), and the ingot 18 having a comparatively large diameter is accommodated in the first ingot accommodating recess 6a. The diameter of the second ingot accommodating recess 6b is slightly larger than that of a cylindrical ingot 20 having a comparatively small diameter (for example, a diameter of four inches), and the ingot 20 having a comparatively small diameter is accommodated in the second ingot accommodating recess 6b.

Thus, the ingot accommodating recess 6 in the present embodiment includes the concentric first and second ingot accommodating recesses 6a and 6b corresponding to the two sizes of ingots 18 and 20. Note that the ingot accommodating recess 6 may be a single circular accommodating recess corresponding to one size of ingot or may include a plurality of concentric accommodating recesses corresponding to three or more sizes of ingots.

Referring to FIGS. 1 to 3B, a plurality of (in the present embodiment, four) levers 22 are disposed in the carrier tray 2 at intervals in a circumferential direction of the ingot accommodating recess 6. Each of the levers 22 has a point of application 24 projecting from a bottom surface of the ingot accommodating recess 6, a point of action 26 projecting from a side surface of the ingot accommodating recess 6, and a fulcrum 28 formed between the point of application 24 and the point of action 26.

Figure 3A:
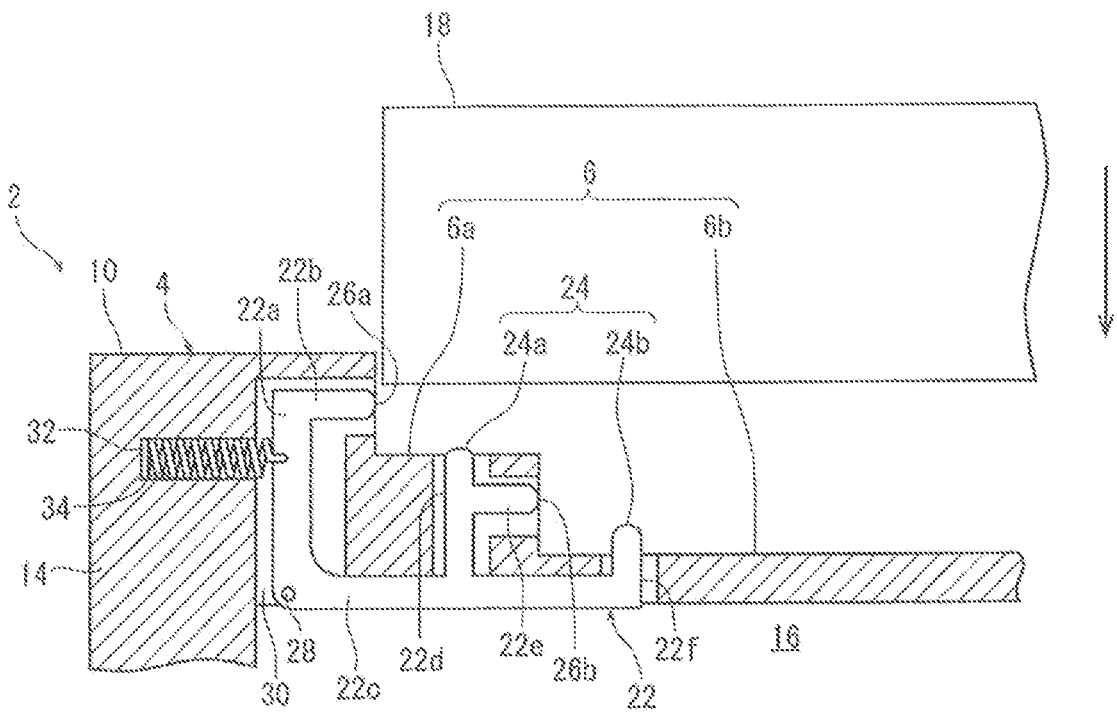
FIG. 3A is a sectional view of the carrier tray depicted in FIG. 1 in a state in which a large-diameter ingot is positioned on an upper side of an ingot accommodating recess.
Figure 3B:
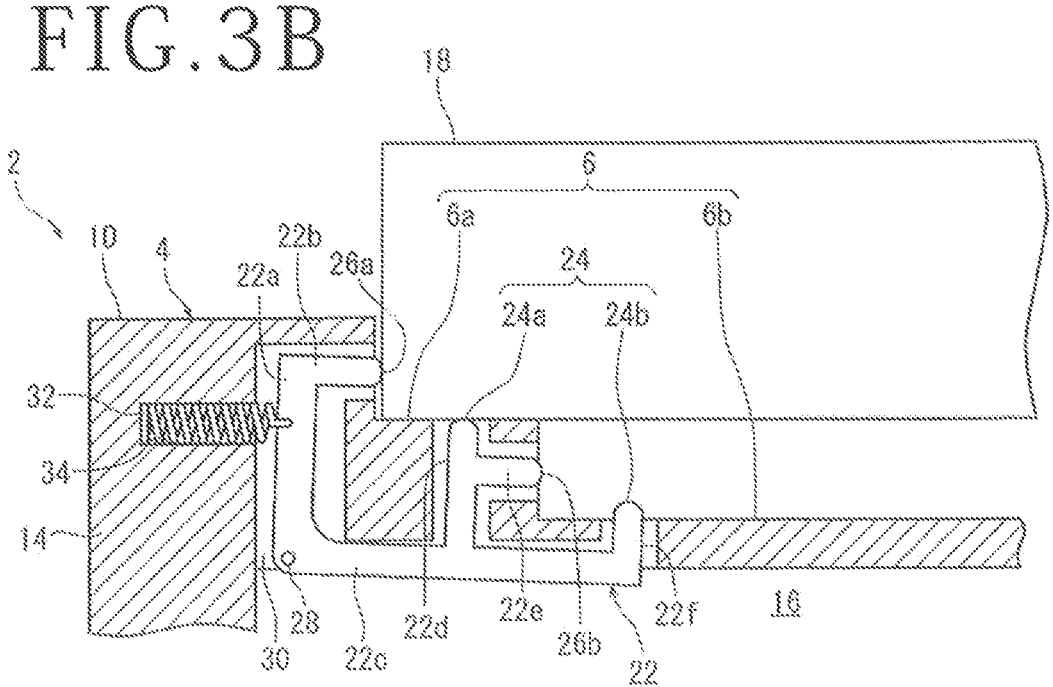
FIG. 3B is a sectional view of the carrier tray depicted in FIG. 1 in a state in which the large-diameter ingot is supported in the ingot accommodating recess.

As understood by referring to FIGS. 3A and 3B, each lever 22 is disposed in an accommodating hole 30 formed in the housing 4 correspondingly to the shape of the lever 22 and is swingably supported to the housing 4 through a pin (reference symbol omitted) penetrating the fulcrum 28.

Figure 2:
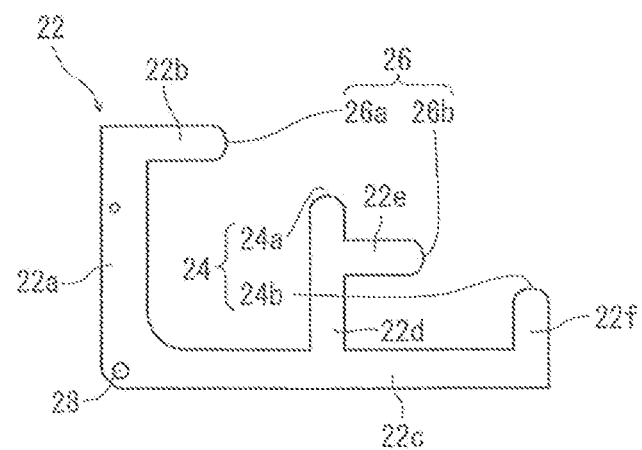
FIG. 2 is a front view of a lever depicted in FIG. 1.

As depicted in FIGS. 2, 3A, and 3B, the lever 22 in the present embodiment has a first section 22a extending upward from the fulcrum 28, a second section 22b extending inward in a radial direction of the ingot accommodating recess 6 from an upper end of the first section 22a, a third section 22c extending inward in the radial direction of the ingot accommodating recess 6 from the fulcrum 28, a fourth section 22d extending upward from the third section 22c between a radial-directionally outer end part and a radial-directionally inner end part of the third section 22c, a fifth section 22e extending inward in the radial direction from the fourth section 22d between an upper end and a lower end of the fourth section 22d, and a sixth section 22f extending upward from the radial-directionally inner end part of the third section 22c.

The point of application 24 of the lever 22 in the present embodiment includes a first point of application 24a composed of an upper end of the fourth section 22d projecting from a bottom surface of the first ingot accommodating recess 6a, and a second point of application 24b composed of an upper end of the sixth section 22f projecting from a bottom surface of the second ingot accommodating recess 6b. The point of action 26 of the lever 22 in the present embodiment includes a first point of action 26a composed of a radial-directionally inner end part of the second section 22b projecting (projectable) from a side surface of the first ingot accommodating recess 6a, and a second point of action 26b composed of a radial-directionally inner end part of the fifth section 22e projecting (projectable) from a side surface of the second ingot accommodating recess 6b.

The lever 22 is swingable about the fulcrum 28 between a support position at which a side surface of the ingot is supported by the point of action 26 and a release position at which the support of the ingot is released. As depicted in FIG. 3A, at the release position, the first point of application 24a projects from the bottom surface of the first ingot accommodating recess 6a, and the second point of application 24b projects from the bottom surface of the second ingot accommodating recess 6b, whereas the first point of action 26a is not projecting from the side surface of the first ingot accommodating recess 6a, and the second point of action 26b is also not projecting from the side surface of the second ingot accommodating recess 6b.

As illustrated in FIG. 3A, the carrier tray 2 in the present embodiment has positioning means 32 provided additionally to the housing 4 for positioning the lever 22 at the release position in the case where the ingot 18 or 20 is not accommodated in the first or second ingot accommodating recess 6a or 6b. The positioning means 32 in the present embodiment includes a coil spring disposed in a hole 34 formed in the housing 4 to extend in the radial direction, a one-side end part of the coil spring is connected to the first section 22a of the lever 22, and an other-side end part of the coil spring is connected to a side surface of the hole 34.

Referring further to FIGS. 3A and 3B, when the ingot 18 of a large diameter is accommodated in the first ingot accommodating recess 6a, the first point of application 24a of the lever 22 is pressed by the ingot 18 and is moved downward as depicted in FIG. 3B. In other words, the first point of application 24a is operated by the weight of the ingot 18 itself. Then, the lever 22 is swung about the fulcrum 28 toward the support position, by overcoming the force of the positioning means 32, and the first point of action 26a of the lever 22 projects from the side surface of the first ingot accommodating recess 6a to support the side surface of the ingot 18. In the carrier tray 2, therefore, the ingot 18 can be stably held during carrying of the ingot 18, so that the ingot 18 can be prevented from falling off. Note that, while any number of levers 22 may be provided, it is preferable to provide three or more levers 22 from a viewpoint of stably holding the ingot 18.

Figure 4A:
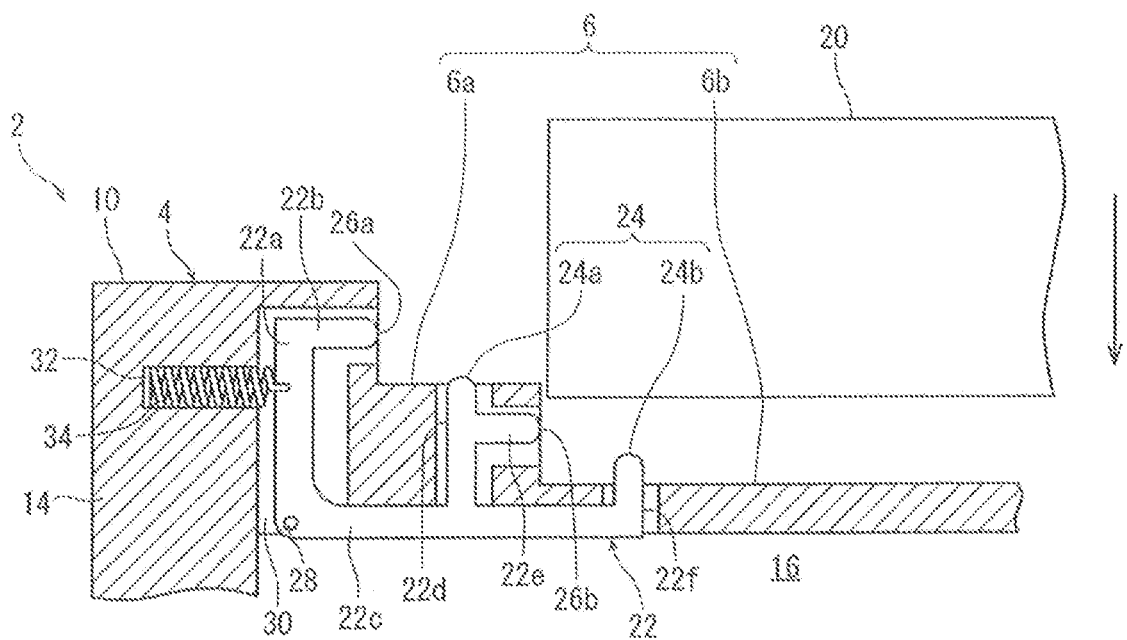
FIG. 4A is a sectional view of the carrier tray depicted in FIG. 1 in a state in which a small-diameter ingot is positioned on an upper side of the ingot accommodating recess.
Figure 4B:
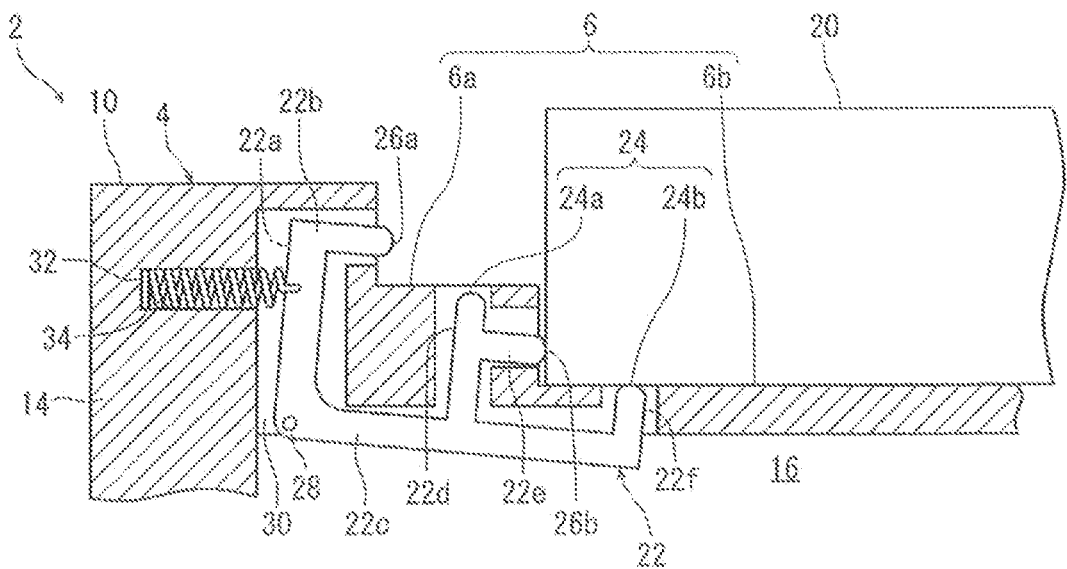
FIG. 4B is a sectional view of the carrier tray depicted in FIG. 1 in a state in which the small-diameter ingot is supported in the ingot accommodating recess.

Referring to FIGS. 4A and 4B, when the ingot 20 of a small diameter is accommodated in the second ingot accommodating recess 6b, the second point of application 24b is operated (moved downward) by the weight of the ingot 20 itself as depicted in FIG. 4B. Then, the lever 22 is swung about the fulcrum 28 toward the support position, by overcoming the force of the positioning means 32, and the second point of action 26b of the lever 22 projects from the side surface of the second ingot accommodating recess 6b to support the side surface of the ingot 20. Thus, the carrier tray 2 has the levers 22 corresponding to the sizes of the ingots 18 and 20 and can stably hold the ingots 18 and 20.

On the other hand, when the ingot 18 or 20 is removed from the first or second ingot accommodating recess 6a or 6b, the weight of the ingot 18 or 20 does not act on the first or second point of application 24a or 24b any longer, and therefore, the lever 22 is swung about the fulcrum 28 toward the release position by the positioning means 32.

Note that the positioning means 32 applying a force to the lever 22 toward the release position includes the coil spring in the present embodiment, but the coil spring is not limitative, insofar as a force is applied to the lever 22 toward the release position to such an extent that the swing of the lever 22 is permitted when the ingot 18 or 20 is accommodated in the first or second ingot accommodating recess 6a or 6b and that the first or second point of action 26a or 26b can support the side surface of the ingot 18 or 20. The material of the positioning means 32 may be a metal, a synthetic rubber, a synthetic resin, or the like.

For Example, in the case where a position of a center of gravity of the lever 22 and a position of the fulcrum 28 are appropriately adjusted such that the lever 22 is positioned at the release position when the ingots 18 and 20 are not accommodated in the first and second ingot accommodating recesses 6a and 6b, the positioning means 32 may not be provided additionally to the housing 4.

Figure 5:
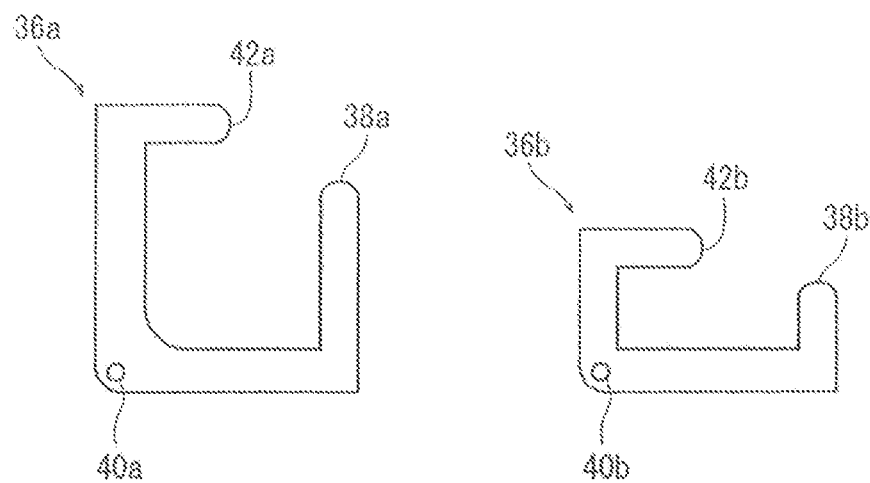
FIG. 5 is a front view of a lever according to a modification.

While the levers 22 described above correspond to the sizes of both of the ingots 18 and 20, a plurality of first levers 36a corresponding to the ingot 18 and a plurality of second levers 36b corresponding to the size of the ingot 20 may be disposed in the housing 4 at intervals in the circumferential direction, as depicted in FIG. 5.

Though not illustrated, a configuration may be adopted in which, when the ingot 18 is accommodated in the first ingot accommodating recess 6a, a first point of application 38a is operated (the first lever 36a is swung about a first fulcrum 40a) by the weight of the ingot 18 itself and a first point of action 42a supports the side surface of the ingot 18, and, when the ingot 20 is accommodated in the second ingot accommodating recess 6b, a second point of application 38b is operated (the second lever 36b is swung about a second fulcrum 40b) by the weight of the ingot 20 itself and a second point of action 42b supports the side surface of the ingot 20.

In addition, in the case where the ingot accommodating recess 6 is a single circular accommodating recess corresponding to one size of ingot, levers corresponding to the one size of ingot are disposed, and, in the case where the ingot accommodating recess 6 includes concentric accommodating recesses corresponding to three or more sizes of ingots, levers corresponding to the three or more sizes of ingots are disposed.

As illustrated in FIG. 1, the wafer accommodating section 8 is formed in an upper surface of the lower wall 12 of the housing 4. The wafer accommodating section 8 in the present embodiment has an annular first wafer accommodating section 8a recessed downward from the upper surface of the lower wall 12, and a circular second wafer accommodating section 8b smaller in diameter than the first wafer accommodating section 8a and recessed further downward as compared to the first wafer accommodating section 8a. The first wafer accommodating section 8a and the second wafer accommodating section 8b are formed concentrically.

The diameter of the first wafer accommodating section 8a is slightly larger than that of a disk-shaped wafer having a comparatively large diameter (for example, a diameter of six inches), and a wafer of a comparatively large diameter is accommodated in the first wafer accommodating section 8a. The diameter of the second wafer accommodating section 8b is slightly larger than a disk-shaped wafer having a comparatively small diameter (for example, a diameter of four inches), and a wafer of a comparatively small diameter is accommodated in the second wafer accommodating section 8b.

Thus, the wafer accommodating section 8 in the present embodiment includes the concentric first and second wafer accommodating sections 8a and 8b corresponding to the two sizes of wafers. Note that the wafer accommodating section 8 may be a single circular accommodating section corresponding to one size of wafer or may include a plurality of concentric accommodating sections corresponding to three or more sizes of wafers.

Figure 6:
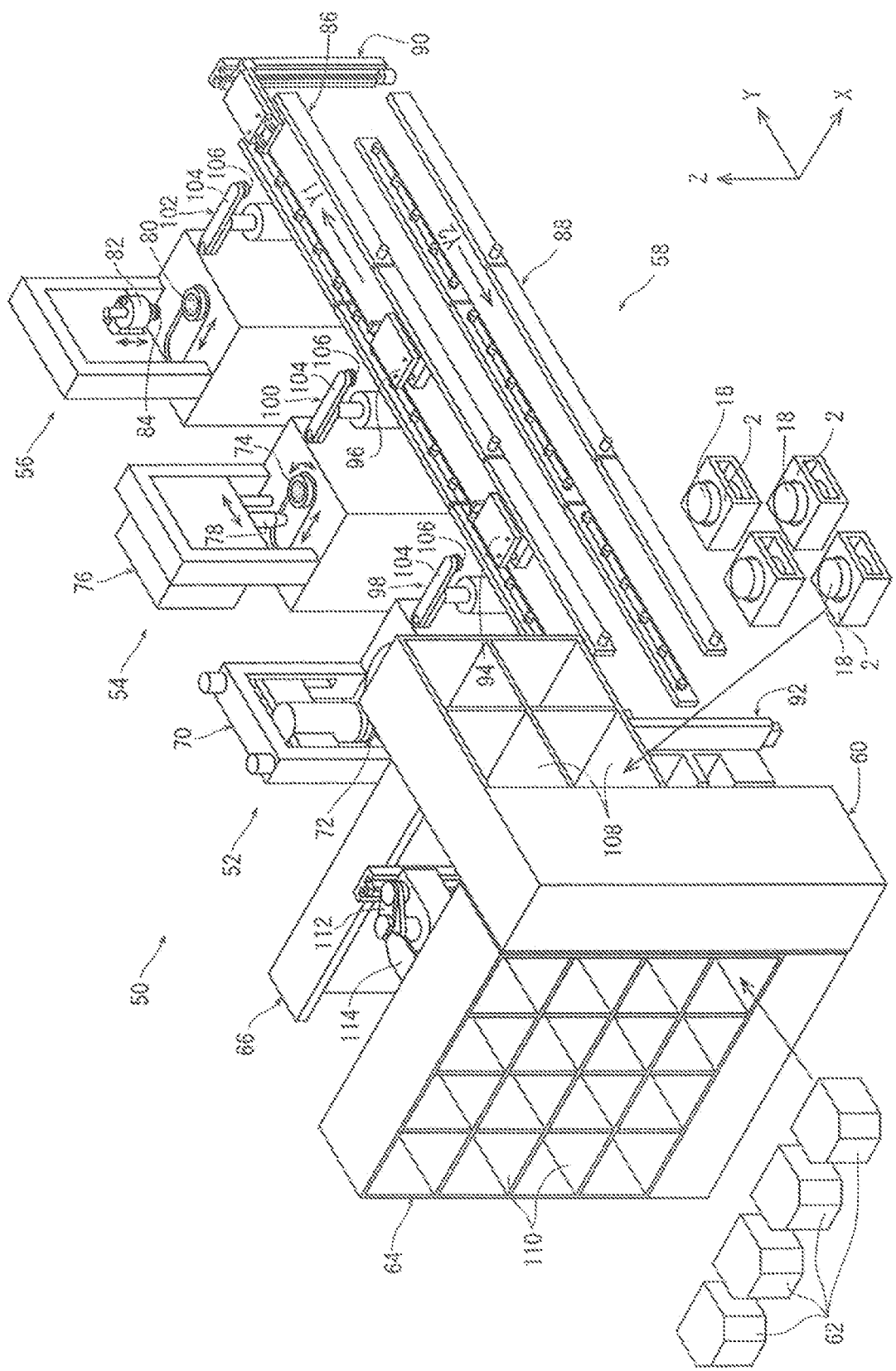
FIG. 6 is a perspective view of a wafer forming apparatus in which the carrier tray depicted in FIG. 1 is used.
Figure 7:
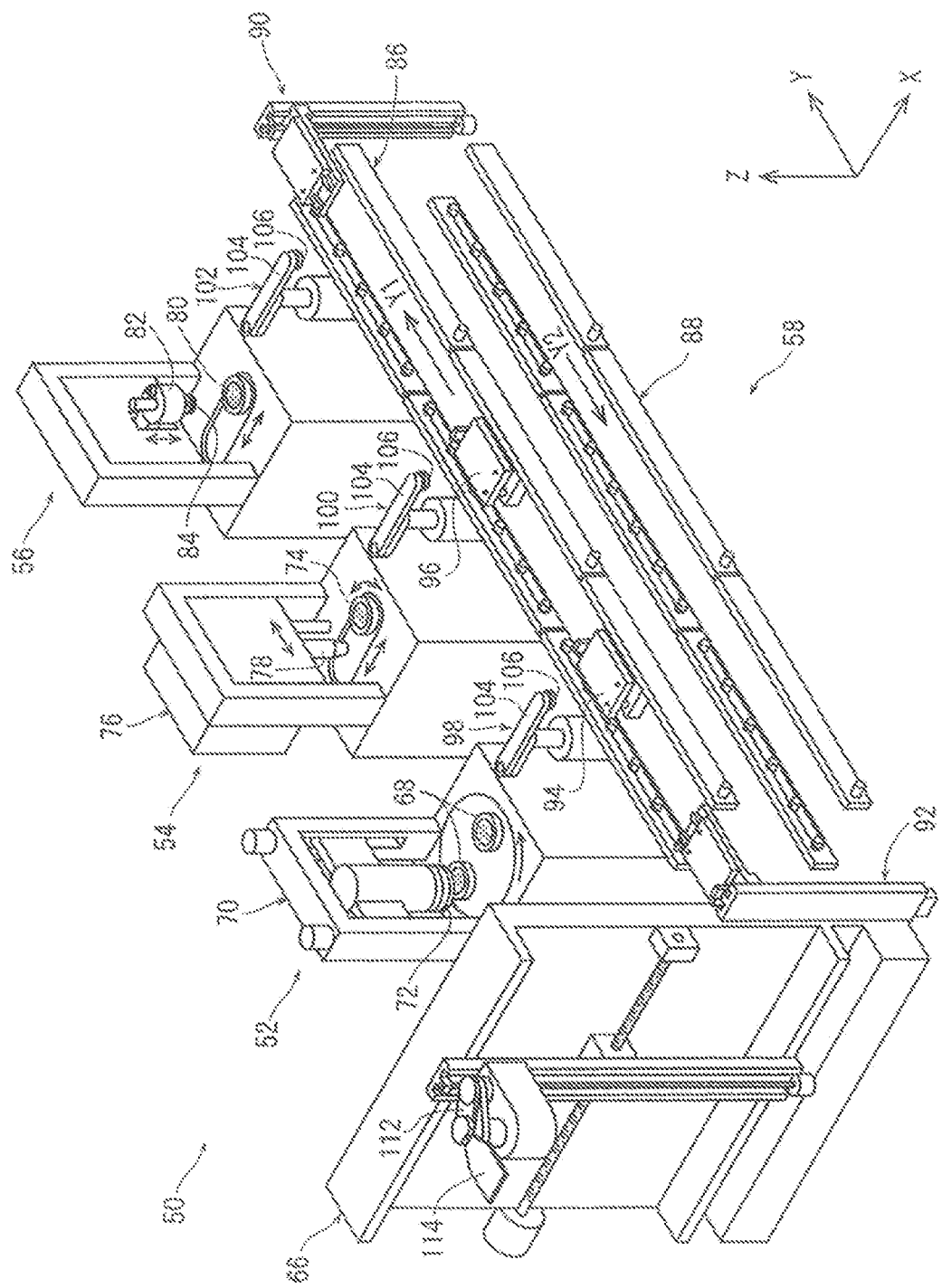
FIG. 7 is a perspective view of part of the wafer forming apparatus depicted in FIG. 6.

FIGS. 6 and 7 illustrate a wafer forming apparatus 50 in which the carrier tray 2 as described above is used. The wafer forming apparatus 50 for forming a wafer from an ingot includes: an ingot grinding unit 52; a laser applying unit 54; a wafer peeling unit 56; a belt conveyor unit 58 that carries the ingot supported by the carrier tray 2 among the ingot grinding unit 52, the laser applying unit 54, and the wafer peeling unit 56; a carrier tray stocker 60; a cassette stocker 64 in which a plurality of cassettes 62 accommodating wafers peeled off from the ingot are accommodated; and accommodating means 66 that carries the carrier tray 2 in the carrier tray stocker 60 to the belt conveyor unit 58 and accommodates the wafer supported in the wafer accommodating section 8 of the carrier tray 2 into the cassette 62 in the cassette stocker 64.

As depicted in FIG. 7, the ingot grinding unit 52 includes a holding table 68 which holds the ingot under suction and is rotatable, and grinding means 70 that grinds an upper surface of the ingot held under suction by the holding table 68 to flatten the upper surface. The grinding means 70 has a grinding wheel 72 which has grindstones (not illustrated) and is rotatable. The ingot grinding unit 52 brings the grindstones into contact with the upper surface of the ingot while rotating the holding table 68 holding the ingot under suction and rotating the grinding wheel 72, to thereby grind the upper surface of the ingot and flatten the upper surface.

The laser applying unit 54 includes a holding table 74 which holds the ingot under suction and is movable in an X-axis direction and rotatable, and laser applying means 76 that applies a laser beam to the ingot held under suction by the holding table 74. The laser applying means 76 has a light concentrator 78 which concentrates a pulsed laser beam emitted by a laser oscillator (not illustrated) to apply the pulsed laser beam to the ingot and is movable in a Y-axis direction.

The laser applying unit 54 applies a laser beam of such a wavelength as to be transmitted through the ingot while positioning a focal point of the laser beam at a depth corresponding to a thickness of a wafer to be formed from the upper surface of the ingot, while moving the holding table 74 holding the ingot under suction in the X-axis direction or while moving the light concentrator 78 in the Y-axis direction, to thereby form a peeling layer lowered in strength inside the ingot.

The wafer peeling unit 56 includes a holding table 80 which holds the ingot under suction and is movable in the X-axis direction, a liquid tank body 82 which forms a liquid accommodating space by cooperating with the holding table 80, and an ultrasonic vibration generating member 84 which applies ultrasonic vibration to the ingot held under suction by the holding table 80 and holds a wafer peeled off from the ingot under suction.

The wafer peeling unit 56, after a liquid is accommodated in the liquid accommodating space formed by the holding table 80 holding the ingot under suction and the liquid tank body 82, operates the ultrasonic vibration generating member 84 to apply ultrasonic vibration to the ingot, to thereby peel off the wafer from the ingot with the peeling layer as a start point.

The belt conveyor unit 58 includes a forward belt conveyor 86 that carries the carrier tray 2 in a Y1 direction, a backward belt conveyor 88 that carries the carrier tray 2 in a Y2 direction (a direction opposite to the Y1 direction), first carrying means 90 that carries the carrier tray 2 from a finish point of the forward belt conveyor 86 to a start point of the backward belt conveyor 88 and stops the carrier tray 2 being carried by the forward belt conveyor 86 at a position for facing the wafer peeling unit 56, and second carrying means 92 that carries the carrier tray 2 from a finish point of the backward belt conveyor 88 to a start point of the forward belt conveyor 86.

In addition, the belt conveyor unit 58 includes a vertically movable first carrier tray stopper 94 that stops the carrier tray 2 being carried by the forward belt conveyor 86 at a position for facing the ingot grinding unit 52, and a vertically movable second carrier tray stopper 96 that stops the carrier tray 2 being carried by the forward belt conveyor 86 at a position for facing the laser applying unit 54.

Further, the belt conveyor unit 58 includes first transferring means 98 that transfers the ingot between the carrier tray 2 stopped by the first carrier tray stopper 94 and the ingot grinding unit 52, second transferring means 100 that transfers the ingot between the carrier tray 2 stopped by the second carrier tray stopper 96 and the layer applying unit 54, and third transferring means 102 that transfers the ingot between the carrier tray 2 stopped by the first carrying means 90 and the wafer peeling unit 56 and that transfers the wafer peeled off from the ingot from the wafer peeling unit 56 onto the carrier tray 2.

Each of the first, second, and third transferring means 98, 100, and 102 which may have a common configuration includes an articulated arm 104 movable in the X-axis direction, the Y-axis direction, and a Z-axis direction, and a suction piece 106 attached to a tip end of the articulated arm 104 so as to be invertable upside down. A one-side surface of the suction piece 106 is formed with a plurality of suction holes (not illustrated) connected to suction means (not illustrated).

Referring to FIG. 6, the carrier tray stocker 60 in the present embodiment has four accommodating sections 108 penetrating in the X-axis direction. In the carrier tray stocker 60, the carrier tray 2 can be accommodated from this side in the X-axis direction in FIG. 6 into one of the accommodating sections 108, and the carrier tray 2 in the accommodating section 108 can be carried out from the depth side in the X-axis direction in FIG. 6.

As depicted in FIG. 6, the cassette stocker 64 in the present embodiment has 16 accommodating sections 110 penetrating in the Y-axis direction, and the cassette 62 accommodating the wafers peeled off from the ingot is accommodated in each of the accommodating sections 110. In the cassette stocker 64, the cassette 62 can be accommodated into one of the accommodating sections 110 from this side in the Y-axis direction in FIG. 6, and the wafers can be accommodated in the cassette 62 in the accommodating section 110 from the depth side in the Y-axis direction in FIG. 6.

As illustrated in FIG. 7, the accommodating means 66 includes an articulated arm 112 movable in the X-axis direction, the Y-axis direction, and the Z-axis direction, and a suction piece 114 attached to a tip end of the articulated arm 112 so as to be invertable upside down. A one-side surface of the suction piece 114 is formed with a plurality of suction holes (not illustrated) connected to suction means (not illustrated).

At the time of forming a wafer from an ingot by the wafer forming apparatus 50, as depicted in FIG. 6, first, one or more ingots (in the present embodiment, four large-diameter ingots 18) are prepared. Next, each of the ingots 18 is accommodated in the first ingot accommodating recess 6a of the carrier tray 2, and a side surface of the ingot 18 is supported by the first points of action 26a, such that the ingot 18 would not fall off from the carrier tray 2 during when the ingot 18 is carried in the wafer forming apparatus 50. Subsequently, the carrier trays 2 supporting the ingots 18 are accommodated into the accommodating sections 108 of the carrier tray stocker 60.

Next, a first carrying step of carrying the ingot 18 from the carrier tray stocker 60 to the laser applying unit 54 is conducted. In general, the ingot has an end face flattened to such an extent as not to hinder incidence of a laser beam in a peeling layer forming step described later. In the present embodiment, therefore, an example of carrying the ingot 18 from the carrier tray stocker 60 to the laser applying unit 54 in the first carrying step is described in the present embodiment. In the case where the end face of the ingot 18 is not flattened to such an extent as not to hinder the incidence of a laser beam in the peeling layer forming step, however, the ingot 18 may be carried from the carrier tray stocker 60 to the ingot grinding unit 52 in the first carrying step.

In the first carrying step, first, the articulated arm 112 of the accommodating means 66 is driven, and the suction piece 114 with the suction holes directed upward is inserted into the tunnel 16 of the carrier tray 2. Next, the suction piece 114 is slightly moved upward in the tunnel 16, and a lower surface of the upper wall 10 of the carrier tray 2 is held under suction by the suction piece 114. Subsequently, the carrier tray 2 held under suction by the suction piece 114 is carried from the carrier tray stocker 60 onto the forward belt conveyor 86.

After the carrier tray 2 is placed on the forward belt conveyor 86, the carrier tray 2 is carried in the Y1 direction by the forward belt conveyor 86 to the position for facing the laser applying unit 54. In this instance, the first carrier tray stopper 94 is lowered, and the second carrier tray stopper 96 is raised, so that the carrier tray 2 is stopped at the position for facing the laser applying unit 54.

Next, the articulated arm 104 of the second transferring means 100 is driven, and the ingot 18 on the carrier tray 2 is held under suction by the suction piece 106. Subsequently, the ingot 18 held under suction by the suction piece 106 is transferred from the carrier tray 2 onto the holding table 74 of the laser applying unit 54. Note that, when the ingot 18 is lifted up from the first ingot accommodating recess 6a, the weight of the ingot 18 does not act on the first points of application 24a any longer, and, therefore, each lever 22 is swung about the fulcrum 28 toward the release position by the positioning means 32.

After the first carrying step is performed, the peeling layer forming step of holding the ingot 18 under suction by the holding table 74 and applying a laser beam of such a wavelength as to be transmitted through the ingot 18 to the ingot 18 with the focal point of the laser beam positioned at a depth corresponding to the thickness of the wafer to be formed from the upper surface of the ingot 18 held under suction by the holding table 74, to thereby form the peeling layer, is conducted at the laser applying unit 54.

After the peeling layer forming step is performed, a second carrying step of carrying the ingot 18 formed with the peeling layer from the laser applying unit 54 to the wafer peeling unit 56 is conducted. In the second carrying step, first, the articulated arm 104 of the second transferring means 100 is driven, and the ingot 18 on the holding table 74 is held under suction by the suction piece 106, and the suction force of the holding table 74 is released. Next, the ingot 18 held under suction by the suction piece 106 is transferred from the holding table 74 to the first ingot accommodating recess 6a of the carrier tray 2.

Subsequently, the carrier tray 2 is carried in the Y1 direction by the forward belt conveyor 86 to the position for facing the wafer peeling unit 56. In this instance, the carrier tray 2 is stopped at the position for facing the wafer peeling unit 56 by the first carrying means 90. Next, the articulated arm 104 of the third transferring means 102 is driven, and the ingot 18 on the carrier tray 2 is held under suction by the suction piece 106. Subsequently, the ingot 18 held under suction by the suction piece 106 is transferred from the carrier tray 2 onto the holding table 80 of the wafer peeling unit 56.

After the second carrying step is performed, a wafer peeling step of holding the ingot 18 formed with the peeling layer under suction by the holding table 80, holding the upper surface of the ingot 18 held under suction by the holding table 80, and peeling off the wafer from the ingot 18 with the peeling layer as a start point is conducted at the wafer peeling unit 56.

After the wafer peeling step is performed, a third carrying step of carrying the wafer (not illustrated) peeled off from the ingot 18 from the wafer peeling unit 56 into the cassette 62 in the cassette stocker 64 and carrying the ingot 18 from which the wafer has been peeled off from the wafer peeling unit 56 to the ingot grinding unit 52 is conducted.

In the third carrying step, first, the articulated arm 104 of the third transferring means 102 is driven, and the wafer peeled off from the ingot 18 is held under suction by the suction piece 106. Next, the wafer held under suction by the suction piece 106 is transferred from the wafer peeling unit 56 into the first wafer accommodating section 8a of the carrier tray 2.

Subsequently, the articulated arm 104 of the third transferring means 102 is driven, the ingot 18 on the holding table 80 is held under suction by the suction piece 106, and the suction force of the holding table 80 is released. Next, the ingot 18 held under suction by the suction piece 106 is transferred from the holding table 80 into the first ingot accommodating recess 6a of the carrier tray 2.

Subsequently, the carrier tray 2 supporting the ingot 18 and the wafer is carried from the forward belt conveyor 86 onto the backward belt conveyor 88 by the first carrying means 90. Next, the carrier tray 2 is carried in the Y2 direction by the backward belt conveyor 88, and the carrier tray 2 is transferred to the second carrying means 92. Subsequently, the carrier tray 2 is carried toward the forward belt conveyor 86 by the second carrying means 92.

The second carrying means 92 is once stopped before the carrier tray 2 is transferred from the second carrying means 92 onto the forward belt conveyor 86. Next, the articulated arm 112 of the accommodating means 66 is driven, and the wafer supported by the carrier tray 2 on the second carrying means 92 is held under suction by the suction piece 114. Then, the wafer held under suction by the suction piece 114 is carried out from the carrier tray 2, and the wafer is accommodated into the cassette 62 in the cassette stocker 64.

Subsequently, the second carrying means 92 is operated to transfer the carrier tray 2 from the second carrying means 92 onto the forward belt conveyor 86, after which the carrier tray 2 is carried in the Y1 direction by the forward belt conveyor 86 to the position for facing the ingot grinding unit 52. In this instance, the first carrier tray stopper 94 is raised, and the carrier tray 2 is stopped at the position for facing the ingot grinding unit 52. Next, the articulated arm 104 of the first transferring means 98 is driven, and the ingot 18 on the carrier tray 2 is held under suction by the suction piece 106. Subsequently, the ingot 18 held under suction by the suction piece 106 is transferred from the carrier tray 2 onto the holding table 68 of the ingot grinding unit 52.

After the third carrying step is performed, an ingot grinding step of holding under suction the ingot 18 from which the wafer has been peeled off by the holding table 68 and grinding the upper surface (peeling surface) of the ingot 18 held under suction by the holding table 68 to flatten the upper surface is conducted at the ingot grinding unit 52.

After the ingot grinding step is performed, a fourth carrying step of carrying the ingot 18 having the upper surface flattened from the ingot grinding unit 52 to the laser applying unit 54 is conducted.

In the fourth carrying step, first, the articulated arm 104 of the first transferring means 98 is driven, the ingot 18 on the holding table 68 is held under suction by the suction piece 106, and the suction force of the holding table 68 is released. Next, the ingot 18 held under suction by the suction piece 106 is transferred from the holding table 68 into the first ingot accommodating recess 6a of the carrier tray 2.

Subsequently, the carrier tray 2 is carried in the Y1 direction by the forward belt conveyor 86 to the position for facing the laser applying unit 54. Next, the articulated arm 104 of the second transferring means 100 is driven, and the ingot 18 on the carrier tray 2 is held under suction by the suction piece 106. Subsequently, the ingot 18 held under suction by the suction piece 106 is transferred from the carrier tray 2 onto the holding table 74 of the laser applying unit 54.

After the fourth carrying step is performed, the above-described peeling layer forming step is conducted at the laser applying unit 54. Then, the peeling layer forming step, the wafer peeling step, the ingot grinding step, and the second to fourth carrying steps are repeated, to form a number of wafers which can be formed from the ingot 18, and the wafers are accommodated into the cassette 62 in the cassette stocker 64.

In the present embodiment, each step performed by the wafer forming apparatus 50 has been described paying attention to a single ingot 18. However, after the first carrying step of carrying the ingot 18 from the carrier tray stocker 60 to the laser applying unit 54 is performed, the first carrying step may be repeated, and the peeling layer forming step, the wafer peeling step, the ingot grinding step, and the second to fourth carrying steps may be repeated in parallel for a plurality of (for example, four) ingots 18, so that a number of wafers which can be formed from the plurality of ingots 18 can be obtained.

As has been described above, in the carrier tray 2 in the present embodiment to be used in the above-described wafer forming apparatus 50, the points of application 24 are operated (moved downward) by the weight of the ingot itself, and the points of action 26 support the side surface of the ingot; therefore, the ingot can be stably held and prevented from falling off while the ingot is being carried.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A carrier tray to be used in a wafer forming apparatus for forming a wafer from a semiconductor ingot, the carrier tray comprising:
   a housing that includes an upper wall, a lower wall, a pair of side walls connecting the upper wall and the lower wall to each other, and a tunnel defined by the upper wall, the lower wall, and the pair of side walls;
   an ingot accommodating recess that is formed in the upper wall of the housing and accommodates the semiconductor ingot;
   a wafer accommodating recess that is formed in the lower wall of the housing and accommodates a wafer; and
   a plurality of levers each of which has a point of application projecting from a bottom surface of the ingot accommodating recess, a point of action projecting from a side surface of the ingot accommodating recess, and a fulcrum formed between the point of application and the point of action, each of the levers being attached to the housing so as to be rotatable around the fulcrum,
   wherein, when the semiconductor ingot is accommodated in the ingot accommodating recess, the points of application of the levers are operated by a weight of the semiconductor ingot itself, and a side surface of the semiconductor ingot is supported by the points of action of the levers.

2. The carrier tray according to claim 1, wherein the ingot accommodating recess includes a plurality of accommodating recesses which are concentric and correspond to a plurality of sizes of semiconductor ingots.

* * * * *